United States Patent
El-Ghoroury

(10) Patent No.: US 10,630,056 B2
(45) Date of Patent: Apr. 21, 2020

(54) NANOPHOSPHORS-CONVERTED QUANTUM PHOTONIC IMAGER FOR EFFICIENT EMISSION OF WHITE LIGHT IN A MICRO-PIXEL ARRAY AND METHODS FOR MAKING THE SAME

(71) Applicant: Ostendo Technologies, Inc., Carlsbad, CA (US)

(72) Inventor: Hussein S. El-Ghoroury, Carlsbad, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

(21) Appl. No.: 15/814,047

(22) Filed: Nov. 15, 2017

(65) Prior Publication Data

US 2018/0083423 A1   Mar. 22, 2018

Related U.S. Application Data

(63) Continuation-in-part of application No. 15/592,629, filed on May 11, 2017, now Pat. No. 10,134,802.

(Continued)

(51) Int. Cl.
*H01S 5/22* (2006.01)
*H01S 5/40* (2006.01)
(Continued)

(52) U.S. Cl.
CPC .......... *H01S 5/2228* (2013.01); *H01L 25/167* (2013.01); *H01L 27/153* (2013.01); *H01L 33/502* (2013.01); *H01S 5/1067* (2013.01); *H01S 5/2018* (2013.01); *H01S 5/405* (2013.01); *H01L 25/0756* (2013.01); *H01L 33/44* (2013.01);

(Continued)

(58) Field of Classification Search
None
See application file for complete search history.

(56) References Cited

U.S. PATENT DOCUMENTS 4,243,909 A * 1/1981 Brecher ............... C09K 11/025
                                                      313/487
6,280,054 B1 * 8/2001 Cassarly ............. G02B 27/0172
                                                      361/240

(Continued)

FOREIGN PATENT DOCUMENTS

EP        2208267          7/2010

OTHER PUBLICATIONS

"Notice of Allowance dated Jul. 18, 2018; U.S. Appl. No. 15/592,629", dated Jul. 18, 2018.

(Continued)

*Primary Examiner* — Nilufa Rahim
(74) *Attorney, Agent, or Firm* — Womble Bond Dickinson, LLP; W. Eric Boyd, Esq.

(57) ABSTRACT

An emissive Solid State Imager (SSI) comprised of a spatial array of digitally addressable multicolor micro pixels. The imager efficiently produces white light by means of a photonic layer excited by a nanophosphors nanoparticle structure in a pixel element comprising an optical confinement cavity which may include a micro lens array for directional modulation of the emitted light or an RGB filter for color output. The light generated is emitted via a plurality of vertical optical waveguides that extract and collimate the light.

15 Claims, 9 Drawing Sheets

Related U.S. Application Data

(60) Provisional application No. 62/335,454, filed on May 12, 2016.

(51) Int. Cl.

| | | |
|---|---|---|
| *H01S 5/20* | (2006.01) | |
| *H01S 5/10* | (2006.01) | |
| *H01L 27/15* | (2006.01) | |
| *H01L 25/16* | (2006.01) | |
| *H01L 33/50* | (2010.01) | |
| H01S 5/00 | (2006.01) | |
| H01L 25/075 | (2006.01) | |
| H01L 33/44 | (2010.01) | |
| H01S 5/183 | (2006.01) | |
| H01L 33/58 | (2010.01) | |
| H01S 5/42 | (2006.01) | |

(52) U.S. Cl.
CPC ............ *H01L 33/504* (2013.01); *H01L 33/58* (2013.01); *H01S 5/0078* (2013.01); *H01S 5/183* (2013.01); *H01S 5/423* (2013.01); *H01S 5/426* (2013.01)

(56) References Cited

U.S. PATENT DOCUMENTS

| | | | |
|---|---|---|---|
| 6,600,175 B1* | 7/2003 | Baretz | H01L 33/50 |
| | | | 257/100 |
| 6,734,465 B1* | 5/2004 | Taskar | H01L 33/502 |
| | | | 257/100 |
| 6,797,412 B1 | 9/2004 | Jain et al. | |
| 6,982,045 B2 | 1/2006 | Menkara et al. | |
| 6,987,353 B2 | 1/2006 | Menkara et al. | |
| 6,992,317 B2 | 1/2006 | Jain et al. | |
| 7,109,648 B2 | 9/2006 | Menkara et al. | |
| 7,112,921 B2 | 9/2006 | Menkara et al. | |
| 7,623,560 B2 | 11/2009 | El-Ghoroury et al. | |
| 7,686,493 B2 | 3/2010 | Roshan et al. | |
| 7,767,479 B2 | 8/2010 | El-Ghoroury et al. | |
| 7,829,902 B2 | 11/2010 | El-Ghoroury et al. | |
| 8,049,231 B2 | 11/2011 | El-Ghoroury et al. | |
| 8,098,265 B2 | 1/2012 | El-Ghoroury et al. | |
| 8,217,406 B2 | 7/2012 | Ramer et al. | |
| 8,243,770 B2 | 8/2012 | El-Ghoroury et al. | |
| 8,567,960 B2 | 10/2013 | El-Ghoroury et al. | |
| 8,702,271 B2 | 4/2014 | Rains, Jr. et al. | |
| 9,159,874 B2 | 10/2015 | Kim et al. | |
| 9,190,576 B2 | 11/2015 | Jeon et al. | |
| 2002/0088985 A1 | 7/2002 | Komoto et al. | |
| 2004/0227465 A1 | 11/2004 | Menkara et al. | |
| 2005/0006656 A1 | 1/2005 | Jain et al. | |
| 2005/0023546 A1 | 2/2005 | Menkara et al. | |
| 2005/0023962 A1 | 2/2005 | Menkara et al. | |
| 2005/0023963 A1 | 2/2005 | Menkara et al. | |
| 2008/0084706 A1 | 4/2008 | Roshan et al. | |
| 2008/0251799 A1 | 10/2008 | Ikezawa | |
| 2009/0086170 A1 | 4/2009 | El-Ghoroury et al. | |
| 2009/0278998 A1 | 11/2009 | El-Ghoroury et al. | |
| 2010/0003777 A1 | 1/2010 | El-Ghoroury et al. | |
| 2010/0066921 A1 | 3/2010 | El-Ghoroury et al. | |
| 2010/0084668 A1 | 4/2010 | Choi et al. | |
| 2010/0091050 A1 | 4/2010 | El-Ghoroury et al. | |
| 2010/0220042 A1 | 9/2010 | El-Ghoroury et al. | |
| 2010/0258828 A1 | 10/2010 | Ramer et al. | |
| 2011/0068676 A1 | 3/2011 | Jeon et al. | |
| 2011/0156071 A1 | 6/2011 | Cheng | |
| 2011/0194304 A1* | 8/2011 | Han | D01D 5/0023 |
| | | | 362/555 |
| 2012/0033113 A1 | 2/2012 | El-Ghoroury et al. | |
| 2012/0130166 A1 | 5/2012 | Nishimura et al. | |
| 2013/0141014 A1 | 6/2013 | Rains, Jr. et al. | |
| 2014/0367633 A1* | 12/2014 | Bibl | G02F 1/133603 |
| | | | 257/13 |
| 2015/0171269 A1 | 6/2015 | Kim et al. | |
| 2016/0240746 A1* | 8/2016 | Yun | H01L 33/56 |
| 2017/0062678 A1* | 3/2017 | Butterworth | H01L 33/505 |
| 2017/0184776 A1 | 6/2017 | El-Ghoroury et al. | |
| 2018/0171220 A1* | 6/2018 | Li | C09K 11/08 |

OTHER PUBLICATIONS

"Office Action dated Dec. 28, 2017; U.S. Appl. No. 15/592,629", dated Dec. 28, 2017.

"International Search Report and Written Opinion of the International Searching Authority dated Jul. 21, 2017; International Application No. PCT/US2017/032554", dated Jul. 21, 2017.

Menkara, H. et al., "Development of nanophosphors for light emitting diodes", Optics Express, vol. 19, No. 24, Jul. 1, 2011, pp. A972-A981.

Nguyen, Nhu T. et al., "Spin-On Glass Materials and Applications in Advanced IC Technologies", University of Twente, Enschede, The Netherlands, Feb. 26, 1999, 156 pp. total.

Oh, Jeong R. et al., "Full down-conversion of amber-emitting phosphor-converted light-emitting diodes with powder phosphors and a long-wave pass filter", Optics Express, vol. 18, No. 11, May 11, 2010, pp. 11063-11072.

Oh, Ji H. et al., "Improved color coordinates of green monochromatic pc-LED capped with a band-pass filter", Optics Express, vol. 21, No. 4, Feb. 14, 2013, pp. 4539-4550.

U.S. Appl. No. 16/194,087, filed Nov. 16, 2018.

* cited by examiner

TiO/SiO or
SiO/SiN
1/4 Wave Stack

NANOPHOSPHORS-CONVERTED QUANTUM PHOTONIC IMAGER FOR EFFICIENT EMISSION OF WHITE LIGHT IN A MICRO-PIXEL ARRAY AND METHODS FOR MAKING THE SAME

CROSS-REFERENCE TO RELATED APPLICATIONS

This application is a continuation-in-part of U.S. patent application Ser. No. 15/592,629, filed on May 11, 2017, which claims the benefit of U.S. Provisional Patent Application No. 62/335,454 filed May 12, 2016, the entirety of which is fully incorporated herein by reference.

BACKGROUND OF THE INVENTION

1. Field of the Invention

The present invention relates to the field of solid state light emitting structures and imagers. More specifically, the invention relates to a solid state light emitting structure comprising a nanophosphors converted excitation layer for the efficient emission of white light from a micro-pixel array.

2. Prior Art

A new class of emissive micro-scale pixel array imager devices has been recently introduced as disclosed in U.S. Pat. No. 7,623,560, El-Ghoroury et al., "Quantum Photonic Imager and Methods of Fabrication Thereof"; U.S. Pat. No. 7,767,479, El-Ghoroury et al., "Quantum Photonic Imager and Methods of Fabrication Thereof"; U.S. Pat. No. 7,829,902, El-Ghoroury et al., "Quantum Photonic Imager and Methods of Fabrication Thereof"; U.S. Pat. No. 8,049,231, El-Ghoroury et al., "Quantum Photonic Imager and Methods of Fabrication Thereof"; U.S. Pat. No. 8,243,770, El-Ghoroury et al., "Quantum Photonic Imager and Methods of Fabrication Thereof"; U.S. Pat. No. 8,567,960, El-Ghoroury et al., "Quantum Photonic Imager and Methods of Fabrication Thereof"; and; U.S. Pat. No. 8,098,265, El-Ghoroury et al., "Hierarchical Multicolor Primaries Temporal Multiplexing System", the entirety of each of which is fully incorporated herein by reference. These patents disclose prior art details of the construction of Quantum Photonic Imagers regarding possible interconnects between photonic layers, waveguide construction, etc., some of which is not repeated herein.

In the instant invention, electrical interconnects between photonic layers, whether within the sidewalls or through a pixel itself, maybe of the same or similar basic construction, such sidewall interconnects also extending through the sidewalls between the pixelated nanophosphors layers, the band-pass filters and the respective photonic layers. In that regard, the word "layer" as used herein and in the claims, such as in a photonic layer, is used in a functional sense, as one skilled in the art would recognize that such a functional layer is comprised of multiple individual layers in a physical sense.

The above disclosed light emitting structures and devices of this type are collectively referred to herein as a "Solid State Imager" or "SSI". These devices desirably feature high brightness, very fast multicolor light intensity and spatial modulation capabilities, all in a very small single device size that includes all necessary image processing drive circuitry. The solid state light (SSL) emitting pixels of such a device may be either a light emitting diode (LED) or laser diode (LD), or both, whose on-off state is controlled by the drive circuitry contained within a CMOS chip (or device) upon which the emissive micro-scale pixel array of the imager is bonded. The pixels within the above emissive micro-scale pixel array devices are individually addressable spatially, chromatically and temporally, typically through the drive circuitry of its CMOS chip. The brightness of the light generated by such imager devices can reach multiple 100, 000 cd/m2 at reasonably low power consumption.

DETAILED DESCRIPTION OF THE PREFERRED EMBODIMENTS

While the earlier-cited SSI devices provide numerous benefits over prior art devices, an enhanced color output SSI device is disclosed herein with increased red and green color light output and control to enable efficient white light output.

Figure 1A:
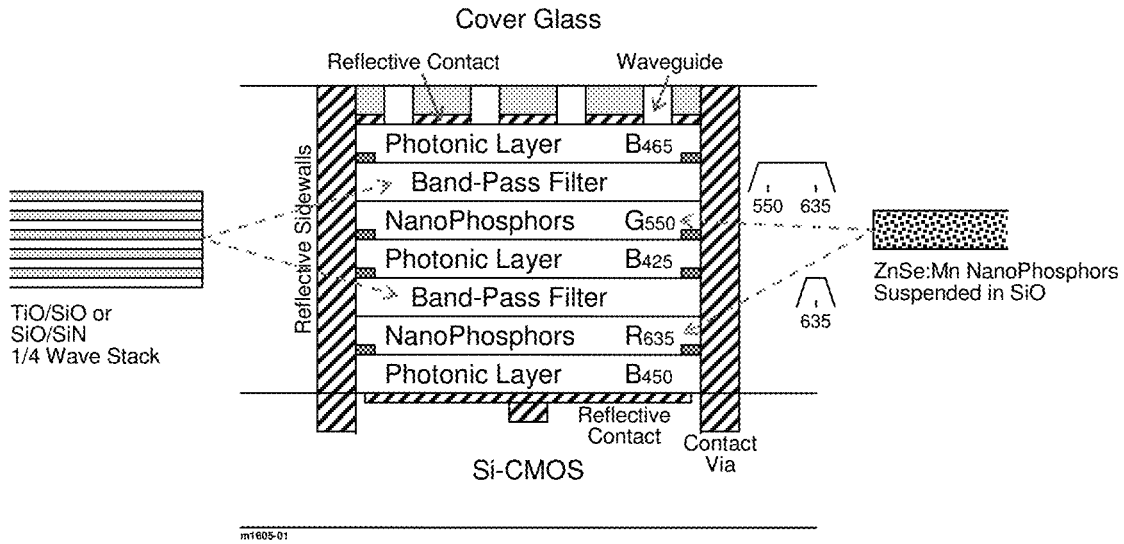
FIG. 1(a) illustrates a preferred embodiment of the Nanophosphors-Converted Solid State Imager (NPC-SSI) of the invention.

Turning to the figures, FIG. 1(a) shows a preferred embodiment of the SSI invention as an example and not by way of limitation, and illustrates the Solid State Imager (SSI) pixel structure comprising a stack of multiple solid state light emitting layers on top of a silicon-based semiconductor complementary metal oxide (Si-CMOS) structure used to independently control the on-off state of each of the multiple solid state light emitting layers of the illustrated pixel structure. The surface dimension of the SSI pixel shown in FIG. 1(a) is typically in the micro-scale with pixel pitches ranging from about 5 microns to about 20 microns or larger. The Solid State Imager (SSI) itself may be comprised of a two-dimensional array of such pixels, enabling the desired pixel resolution in terms of the number of rows and columns forming the array of SSI micro-pixels.

Each of the layers within the stack of multiple solid state light emitting layers of the SSI pixels may be designed to emit a different color, thus allowing the SSI pixel to be controlled through its Si-CMOS to emit any desired combination of multiple colors; for example, red (R), green (G) and blue (B), from the same pixel aperture.

Referring back to FIG. 1(a), in this invention at least one of the solid state light emitting layers of the SSI pixels may be created using a nanophosphors-converted solid state light emitter. The nanophosphors-converted solid state light emitting layers of the SSI pixel illustrated in FIG. 1(a) may be designed to emit the desired color; for example, G or R, after being excited by an appropriately selected wavelength in the violet-blue wavelength range (380-450 nm). In FIG. 1(a), one of the nanophosphors-converted solid state light emitting layers of the SSI pixel may be excited using a 425 nm wavelength source to emit G light at 550 nm (G-550) and another is excited using a 450 nm wavelength source to emit R light at 635 nm (R-635). In both cases, the 425 nm and 450 nm excitation wavelengths light sources may be generated using III-V semiconductor alloy indium gallium nitride (InGaN) solid state light emitting structures.

The blue emitting layer of the nanophosphors-converted NPC-SSI pixel illustrated in FIG. 1(a) may also be an InGaN solid state light emitting structure designed to emit 465 nm light. Therefore, with the SSI pixel illustrated of FIG. 1(a), all of the solid state light emitting layers may be InGaN solid state light emitting structures emitting light in the violet-blue (425-465 nm) wavelength range. Since InGaN solid state light emitting structures operating in such a wavelength range can be designed to achieve a high internal quantum efficiency (IQE) that reaches 0.95, the light emitting layers of the SSI pixel structure shown in FIG. 1(a) consequently exhibit improved power consumption efficiency.

Figure 2:
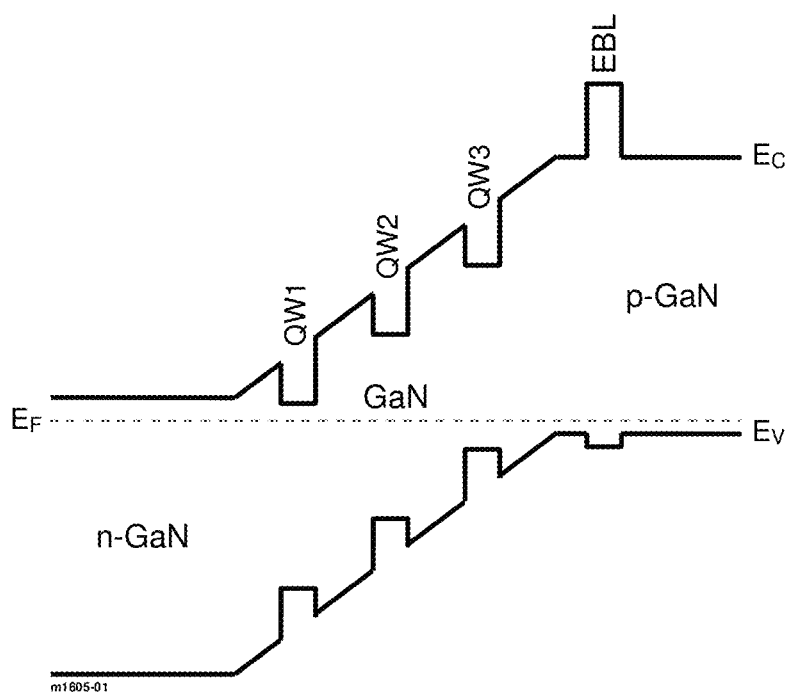
FIG. 2 illustrates the energy band structure of the multiple quantum well (MQW)-based InGaN solid state light emitting structures in the violet-blue (425-465 nm) wavelength range used in the Nanophosphors-Converted Solid State Imager (NPC-SSI) of the invention.

The typical energy band structure of the multiple quantum well (MQW)-based InGaN solid state structures emitting light in the violet-blue (425-465 nm) wavelength range is illustrated FIG. 2. The indium (In) content within InGaN MQWs of these III-V solid state light emitting structures is typically in the range of 0.12-0.2. At these levels of indium content, MQW-based InGaN solid state light emitting structures have achieved IQE in the range of ~0.95. The InGaN solid state light emitting structure material is typically epitaxially grown on sapphire ($Al_2O_3$) wafers that may be about 2"-6" in diameter using known metalorganic chemical vapor deposition (MOCVD) techniques.

Figure 3:
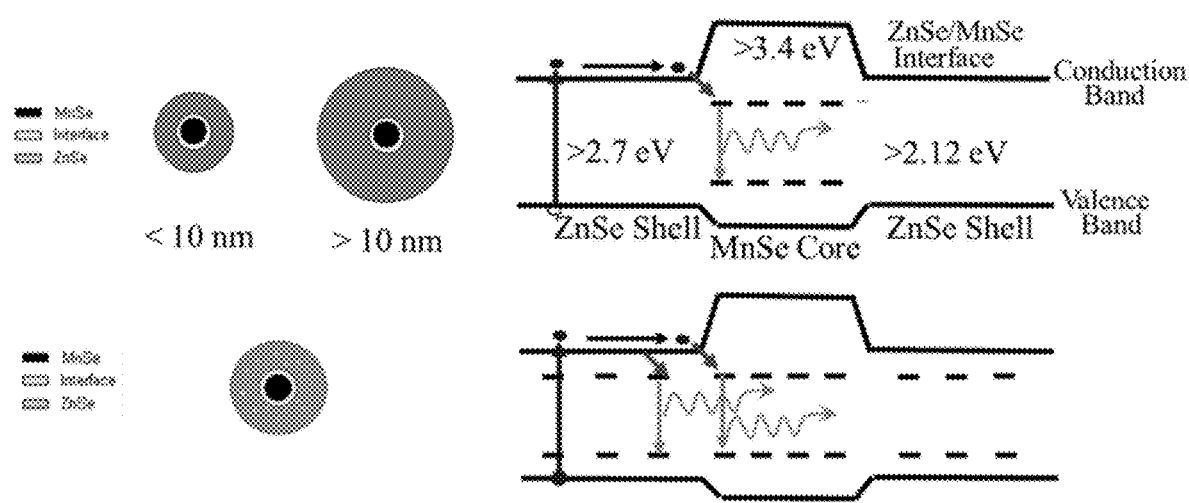
FIG. 3 illustrates the energy band structure of the nanophosphors used in the light emitting layers of the Nanophosphors-Converted Solid State Imager (NPC-SSI) of the invention.

In FIG. 1(a), both the G and R light emissions are generated by the nanophosphors layers that in turn are excited by their associated InGaN solid state violet-blue light emitting layers. An exemplar nanophosphors-conversion process is illustrated in the example of FIG. 3. In this example, II-VI semiconductor nanocrystalinephosphors nanoparticles are formed using Manganese-doped Zinc Selenide (ZnSe:Mn). These nanoparticles are formed to have an inner core (or nucleus) ~2 nm in diameter formed from either Manganese Selenide (MnSe) or heavily Manganese doped (Mn-rich, e.g., $10^{18}$ $cm^{-3}$ to $10^{18}$ $cm^{-3}$) MnZnSe alloy. These nano-scale nuclei are then grown into nanoparticles having an outer shell of Zinc Selenide (ZnSe) to create the desired energy band structure that depends both on the properties of the ZnMnSe alloy and on those of the substitutionally-incorporated Mn ion dopant. In typical ZnSe:Mn nanophosphors, the MnSe core is covered by a ZnSe shell to form a nanocrystalline particle size of ~10 nm in diameter.

Due to the band gap of the ZnSe shell, the nanophosphors energy band structure illustrated in the example of FIG. 3 absorbs excitation light at a wavelength of ~460 nm or shorter. Mn-doping of the nanophosphors ZnSe shell is used to tune the excitation light at the desired wavelength shorter than 460 nm; for example, the 425 nm and 450 nm used in the excitation layers design example of the NPC-SSI structure illustration of FIG. 1(a). In addition, the Mn doping of both the ZnSe shell and the MnSe core of the nanophosphors particulate creates narrower intermediate energy bands within both the shell and the core wider band gaps. The carriers that are photo-excited by the absorption of the excitation light within the ZnSe shell relax through the interface between the ZnSe shell and the MnSe core, then radiatively recombine across the Mn doping intermediate band gaps, causing the emission of the target wavelengths; 550 nm and 635 nm in the case of the NPC-SSI pixel structure illustrated in FIG. 1(a). The quantum yield (QY) of violet-blue excited ZnSe:Mn nanophosphors has been demonstrated at levels higher than 0.8.

An alternative for the II-VI nanoparticle structures described in the previous paragraphs for generating the R emission in the NPC-SSI pixel structure of FIG. 1(a) is Europium ($Eu^{3+}$)-doped Yttrium Oxide ($Y_2O_3$) nanoparticles. The advantage of using $Y_2O_3$:Eu nanophosphors is its narrow (highly saturated) R-621 nm emission. Another alternative for generating the R emission in the NPC-SSI pixel structure of FIG. 1(a) is Eu-doped Strontium Silicate (($Sr,Ba,Ca)_3SiO_5$:Eu) nanophosphors, which offers the same advantage as highly saturated R-621 nm emission as an alternative.

The nanophosphors-conversion layers illustrated in FIG. 1(a) may be realized by suspending the nanophosphors materials described in the preceding paragraphs in a Silicon Oxide ($SiO_2$) layer deposited on the topside of their corresponding excitation light emission layers. In this process, the nanophosphors particles are first mixed into liquid-form Spin-on-Glass (SOG) at a user-defined ratio needed to achieve the desired level of excitation light absorption, then the liquid mixture is coated as a thin layer on top of the excitation light emitting layer. Subsequently, the SOG is cured by annealing it into $SiO_2$, resulting in the nanophosphors particles being suspended in the G and R emission nanophosphors layers.

Figure 4:
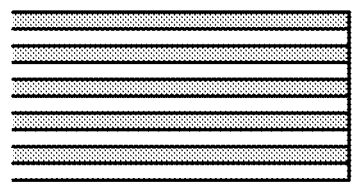
FIG. 4 illustrates the quarter-wave stack structure of the band-pass filter (BPF) layers associated with each of the nanophosphors layers of the Nanophosphors-Converted Solid State Imager (NPC-SSI) of the invention.

Referring back to FIG. 1(a), capping each of the G and R emission nanophosphors layers is a Band-Pass Filter (BPF) layer having multiple purposes, the most important of which is to filter out the excitation light used to optically pump the associated nanophosphors layers. FIG. 4 illustrates the structure of the BPF layer associated with each of the nanophosphors layers of the NPC-SSI structure of FIG. 1(a). As illustrated in the preferred embodiment of FIG. 4, each of the BPF layers is a ¼ wave stack of dielectric layers with alternating high/low index values. Examples of dielectric materials that can be used to realize the BPF layers include Titanium Oxide ($TiO_2$) or Silicon Nitride ($Si_3N_4$) for creating BPF high index layers with indexes in the range of 2.49-2.6 for the former and 2.02 for the latter; respectively, and Silicon Oxide ($SiO_2$) for creating BPF low index layers with indexes in the range of 1.4-1.55.

As illustrated in FIG. 1(a), the interior of the SSI pixel is an optical confinement cavity defined by the pixel's reflective sidewalls and reflective contacts. The addition of the BPF layers capping each of the G and R emission nanophosphors layers further divides the SSI pixel's optical confinement cavity into optical confinement sub-cavities each associated with the R and the G emission layers of the NPC-SSI. The optical confinement sub-cavity associated with the R emission layers is defined by the pixel's reflective sidewalls and lower contact plus the reflective action of its associated BPF layer which reflects the excitation light of that layer as well as any secondary broadband emission from the associated R emission nanophosphors layer. Similarly, the optical confinement sub-cavity associated with the G emission layers is defined by the pixel's reflective sidewalls plus the reflective action of its associated BPF filter layer which reflects the excitation light of that layer as well as any secondary broadband emission from the associated R emission nanophosphors layer. In addition, the BPF associated with G emission nanophosphors layer transmits the emission from the R emission layers below it.

Figure 5:
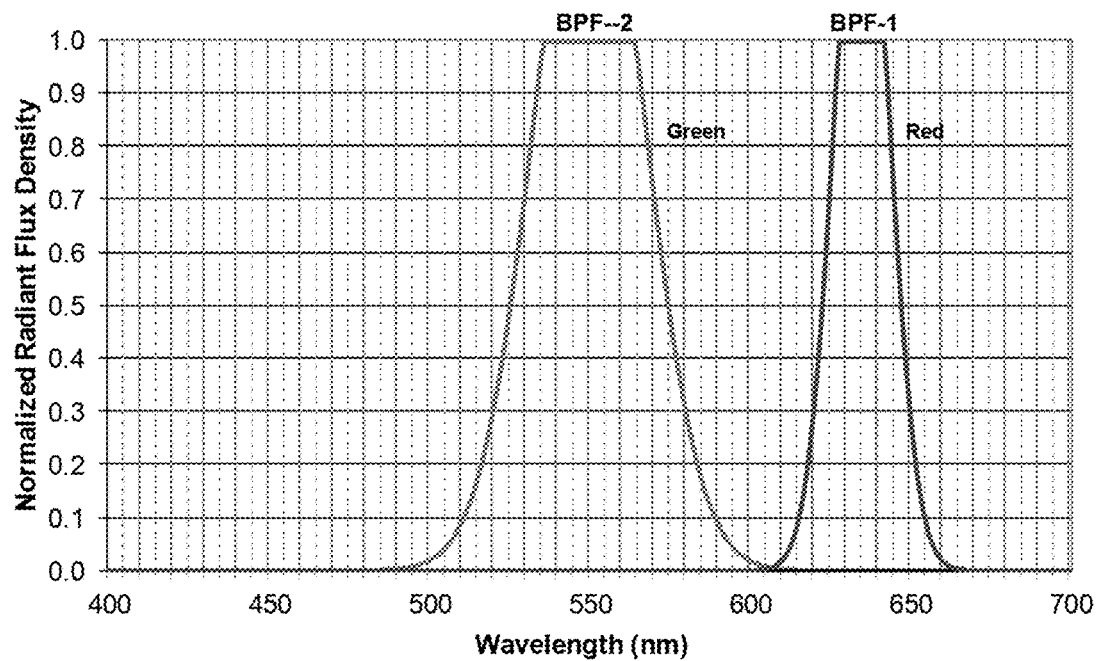
FIG. 5 illustrates the spectral responses of the band-pass filter (BPF) layers associated with each of the nanophosphors layers of the Nanophosphors-Converted Solid State Imager (NPC-SSI) of the invention.

FIG. 5 illustrates the spectral responses of the band-pass filter (BPF) layers associated with each of the nanophosphors layers of the Nanophosphors-Converted Solid State Imager (NPC-SSI) of the invention. As illustrated in FIG. 5, the BPF associated with the R emission layers, herein referred to as BPF-1, will transmit spectral wavelengths centered around the target R emission peak wavelength (635 nm) plus an allowance for the target full width at half maximum (FWHM) of the R emission. For example, if the target R emission peak wavelength and FWHM are 635 nm and 20 nm respectively, then the BPF layer capping R emission nanophosphors layer will have a commensurate center wavelength and FWHM bandwidth. Similarly, the BPF associated with the G emission layers, herein referred to as BPF-2, will transmit spectral wavelengths centered around the target G emission peak wavelength (550 nm) plus an allowance for the target full width at half maximum (FWHM) of the G emission. For example, if the target G emission peak wavelength and FWHM are 550 nm and 40 nm respectively, then the BPF layer capping G emission nanophosphors layer will have a commensurate center wavelength and FWHM bandwidth.

Also as illustrated in FIG. 5, a second spectral band-pass of the BPF associated with the G emission layers will transmit spectral wavelengths centered around the target R emission peak wavelength (550 nm) plus an allowance for its target full width at half maximum (FWHM) of the R emission, thus allowing the BPF capping G emission nanophosphors layer to transmit both the G emission of its associated nanophosphors layer and as well as the R emission from NPC layer below it.

As illustrated in FIG. 5, each of the BPFs associated with the R and G emission NPC layers blocks, through reflection, the Violet-Blue (V-B) excitation light associated with each of the NPC layers that was not absorbed, thus not converted into the target wavelength light emissions, by their associated nanophosphors layers. The V-B excitation light associated with each of the R and G emission NPC layers reflected by their associated BPFs will then be recycled by the optical confinement action of each corresponding optical confinement sub-cavities of the R and G emission NPC layers. The result is not only the blocking of the V-B excitation light from the pixel spectral emission, but also an increased absorption of the V-B excitation light by their corresponding nanophosphors layers, resulting in an increased nanophosphors conversion efficiency for the R and G emission from the NPC-SSI pixels.

The preceding discussion identifies the following multiple uses of the BPFs associated with the R and G emission NPC layers: (1) blocking of the V-B excitation light associated with each of the NPC layers; (2) recycling of the V-B excitation light associated with each of the NPC layers; and, (3) shaping of the R and G pixel spectral emission to match the desired center wavelength and FWHM. The latter use is particularly important because it enables shaping the emission gamut of the NPC-SSI to match a desired multicolor emission gamut, for example the NTSC or HD gamut for display applications. Also of particular importance in this regard is the use of the BPFs associated with the R and G emission NPC layers to match the photopic response of the Human Visual System (HVS) in making the FWHM achieved by the BPF of the G emission layer wide enough, for example 40-50 nm FWHM, to take advantage of the higher photopic efficiency in that spectral region in order to increase the HVS perceived brightness of the light emission from the NPC-SSI of this invention.

A preferred fabrication process for the NPC-SSI structure illustrated in FIG. 1(a) includes the steps described in the following paragraphs. The process begins with forming an array of SSI pixels on semiconductor light emitting photonic wafers of the B emission and V-B excitation emission photonic wafers. A preferred method of this process, which herein is referred to as "pixelation", involves the etching of the pixels sidewalls, having about 1 micron in width and a depth extending through the heterojunction diode structure of the semiconductor light emitting material, using known semiconductor lithography and etch processes. The etched pixel array sidewalls are passivated with thin layers of either silicon oxide or silicon nitride using semiconductor deposition processes, then coated with a thin layer of reflective metal, such as Aluminum (Al), for example. The pixel sidewalls are then filled with metal using semiconductor metal deposition processes. The same pixelation pattern is then processed on the B emission and V-B photonic wafers. Alignment marks are added on the wafers to aid alignment of the etched pixel patterns during subsequent processing.

Figure 6A:
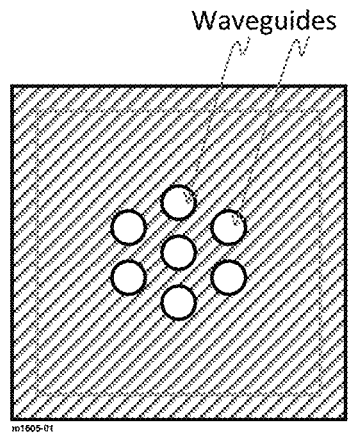
FIGS. 6(a) to 6(c) illustrate a set of preferred embodiments of micro-pixel metal contact layer patterns used in the Nanophosphors-Converted Solid State Imager (NPC-SSI) of the invention.
Figure 6B:
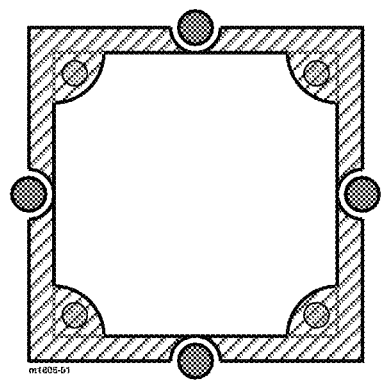

After the semiconductor light emitting photonic wafers of the B emission and V-B photonic wafers are pixelated, the top contact patterns illustrated in FIGS. 6(a) and (b) are deposited on the formed pixel array using semiconductor metal deposition techniques such as electron beam deposition. The contact pattern illustrated in FIG. 6(a) is used for the B emission photonic wafers and the contact pattern illustrated in FIG. 6(b) is used for the V-B excitation light photonic wafers. The deposited contact metal is preferably a thin metal stack, for example Ti/Al, that forms an ohmic contact with the indium gallium nitride (InGaN) heterojunction diode semiconductor light emitting structure of the B emission and V-B photonic wafers.

In a preferred method for fabricating the NPC-SSI structure illustrated in FIG. 1(a), a glass wafer, for example, is used as a substrate upon which the multilayer pixel structures are stacked and then bonded to the top surface of a Si-CMOS wafer (drive circuitry wafer) which is processed to include the same pixel pattern as the multilayer pixel structure stacked on the glass wafer.

Figure 1B:
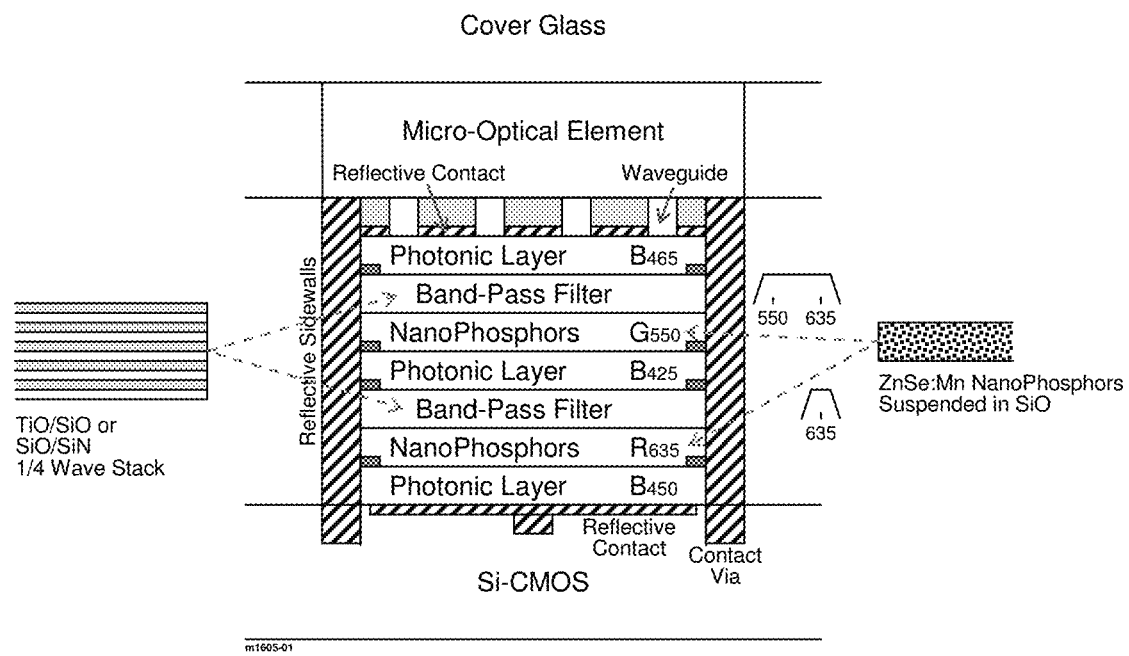
FIG. 1(b) illustrates an alternative embodiment of the Nanophosphors-Converted Solid State Imager (NPC-SSI) of the invention.

In another approach for fabricating the NPC-SSI structures illustrated in FIG. 1(b), the Si-CMOS is used as a substrate upon which the multilayer pixel structures and nanophosphors nanoparticle structures are stacked, then the pixelated multilayer wafer is bonded to a glass cover wafer. In either approach, the processing steps are similar and the former will be used to describe the rest of the preferred NPC-SSI fabrication process.

FIGS. 6(a) and (b) illustrate an exemplar pattern of the micro-pixel metal contact layers deposited on the respective top surfaces of the above-described pixelated B and V-B photonic wafers using conventional semiconductor and lithography and metal deposition fabrication processes. The pixel contact pattern shown in FIG. 6(a) may be used on the pixelated B photonic wafers as waveguides to generate collimated (for example, ±17°) to quasi-Lambertian (for example, ±45°) pixel emission when the contact openings' diameter, height and spacing form the proper optical waveguide structure for extracting the light emitted from the NPC-SSI pixels. The pixel contact pattern shown in FIG. 6(b) is used on the pixelated B photonic wafers to generate Lambertian emission from the NPC-SSI pixels. The pixel contact pattern shown in FIG. 6(b) is also used on the pixelated V-B photonic wafers to allow maximum light transmission from the lower to upper layers of the NPC-SSI pixel structures.

In an alternative preferred embodiment of the NPC-SSI pixel structure illustrated in FIG. 1(b), a glass cover wafer is first processed to pattern an array of pixel-size micro-optical elements defining a micro lens array that matches the NPC-SSI pixel array, thereby providing a single micro-optical element per pixel. When the glass cover wafer with the pixel-size micro-optical elements is used as the substrate upon which the NPC-SSI multilayer stack is formed, the resultant pixel array has the capability, in addition to modulating the color and brightness of the individual pixels in the array, of modulating the direction of the pixel's light emission.

After the B photonic wafer is pixelated and top contact layers are deposited, the wafer is bonded to the glass cover wafer, with or without the pixel-size micro-optical elements incorporated, using semiconductor bonding techniques such as fusion bonding, for example. The epitaxial growth sapphire wafer is then lifted off, typically using semiconductor laser lift off (LLO) techniques, and the structure is thinned down to remove the epitaxial growth GaN buffer, leaving only a thin layer (<2 micron) comprising the B-465 semiconductor light emitting heterojunction diode structure enclosed within the formed pixels' sidewalls. With the backside of the pixelated B-465 photonic wafer exposed, the pixel array backside contact pattern of FIG. 6(b) is deposited as a thin metal stack, for example Ti/Al, using semiconductor metal deposition techniques.

The pixelated B-465 photonic wafer backside is then processed to deposit the BPF-2 layers in accordance with the process described earlier to realize the spectral response illustrated in FIG. 5. After the BFF-2 layers are deposited, the wafer surface is processed further to extend the pixel sidewalls through the BFF-2 layers, including etching, passivation and metal deposition as described earlier. This step extends the pixel reflective sidewall to enclose the pixelated elements of the BPF-2 within each pixel structure.

Figure 7:
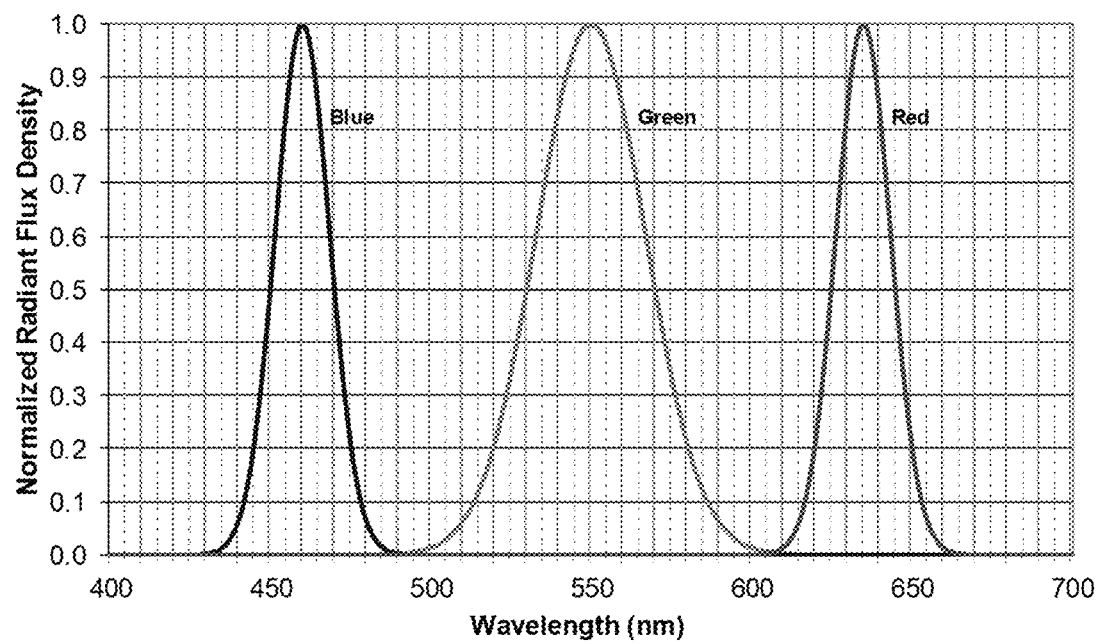
FIG. 7 illustrates the spectral emission of the micro-pixels of the Nanophosphors-Converted Solid State Imager (NPC-SSI) of the invention.

The BPF-2 side of the pixelated wafer is then processed to deposit the G-550 nanophosphors layer in accordance with the process described earlier to realize the G-550 nanophosphors-converted spectral emission illustrated in FIG. 7. After the G-550 nanophosphors layer is deposited, the wafer surface is processed further to extend the pixel sidewalls through the G-550 nanophosphors layer including etching, passivation and metal deposition as described earlier. This step extends the pixel reflective sidewall to enclose pixelated elements of the G-550 nanophosphors layer within each pixel structure.

The topside of the NPC-SSI in-process wafer is then processed to bond the B-425 excitation photonic layer. This is accomplished by bonding the pixelated B-425 photonic wafer to the topside of the NPC-SSI in-process wafer using semiconductor bonding process such as fusion bonding, for example. In this process, the extended pixels sidewalls of the pixelated B-425 photonic are also bonded in the same bonding step with the sidewalls of the pixelated B-425 excitation photonic wafer.

With the pixelated B-425 excitation photonic wafer bonded to the NPC-SSI in-process wafer, the epitaxial growth sapphire wafer of the B-425 excitation photonic wafer is then lifted off, typically using semiconductor laser lift off (LLO) techniques and the structure is thinned down to remove the epitaxial growth GaN buffer, leaving only a thin layer (<2 micron) comprising the B-425 semiconductor light emitting heterojunction diode structure enclosed within the formed pixel sidewalls. With the backside of the pixelated B-425 photonic wafer exposed, the pixel array backside contact pattern of FIG. 6(b) is deposited as a thin metal stack, for example Ti/Al, using semiconductor metal deposition techniques.

The topside of the NPC-SSI in-process wafer is then processed to deposit the BPF-1 layers in accordance with the process described earlier to realize the spectral response illustrated in FIG. 5. After the BFF-1 layers are deposited, the NPC-SSI in-process wafer surface is processed to extend the pixel sidewalls through the BFF-1 layers including etching, passivation and metal deposition as described earlier. This step extends the pixel reflective sidewall to enclose pixelated elements of the BPF-1 within each pixel structure.

The BPF-1 side of the NPC-SSI in-process wafer is then processed to deposit the G-550 nanophosphors layer in accordance with the process described earlier to realize the R-635 nanophosphors-converted spectral emission illustrated in FIG. 7. After the R-635 nanophosphors layer is deposited, the wafer surface is processed further to extend the pixel sidewalls through the R-635 nanophosphors layer including etching, passivation and metal deposition as described earlier. This step extends the pixel reflective sidewall to enclose pixelated elements of the R-635 nanophosphors layer within each pixel structure.

The topside of the NPC-SSI in-process wafer is then processed further to bond the B-450 excitation photonic layer. This is accomplished by bonding the pixelated B-450 photonic wafer to the topside of the NPC-SSI in-process wafer using semiconductor bonding processes such as fusion bonding, for example. In this process, the extended pixel sidewalls of the pixelated B-450 photonic are also bonded in the same bonding step with the sidewalls of the pixelated B-450 excitation photonic wafer.

With the pixelated B-450 excitation photonic wafer bonded to the NPC-SSI in-process wafer, the epitaxial growth sapphire wafer of the B-450 excitation photonic wafer is then lifted off, typically using semiconductor laser lift off (LLO) techniques and the structure is thinned down to remove the epitaxial growth GaN buffer leaving only a thin layer (<2 micron) comprising the B-450 semiconductor light emitting heterojunction diode structure enclosed within the formed pixel sidewalls. With the backside of the pixelated B-450 photonic wafer exposed, the pixel array backside contact pattern of FIG. 6(c) is deposited as a thin metal stack, for example Ti/Al, using semiconductor metal deposition techniques.

Figure 6C:
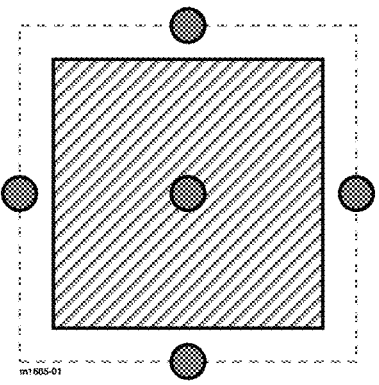

As illustrated in the preferred embodiment of FIG. 6(c), the topside of the NPC-SSI in-process wafer has three contact vias per pixel; the center contact via, which is the unique contact of the B-450 excitation photonic layer of the pixel, the x-sidewall contact via which is the unique contact of the B-425 excitation photonic layer of the pixel and the x-sidewall contact via, which is the unique contact of the B-425 excitation photonic layer of the pixel. The common contacts for the entire pixel array; namely, the three intermediate contact layers on the topside of the B-465, B-425 and B-450 photonic layers are formed as common contact rails that extend to the peripheral edges of the NPC-SSI die where they are connected to a set of common contact vias forming a ring at the peripheral boundaries of the NPC-SSI die. The NPC-SSI in-process wafer topside then comprises an array of micro-scale contact vias whereby the pixel-center via is the unique contact of the B-450 excitation photonic layer of the pixel array, the x-sidewall contact via is the unique contact of the B-425 excitation photonic layer of the pixel array, the y-sidewall contact via is the unique contact of the B-465 emission photonic layer of the pixel array and the micro-via ring at the peripheral boundaries of the NPC-SSI die, providing the common contacts of all three photonic layers of the pixel array.

Figure 8:
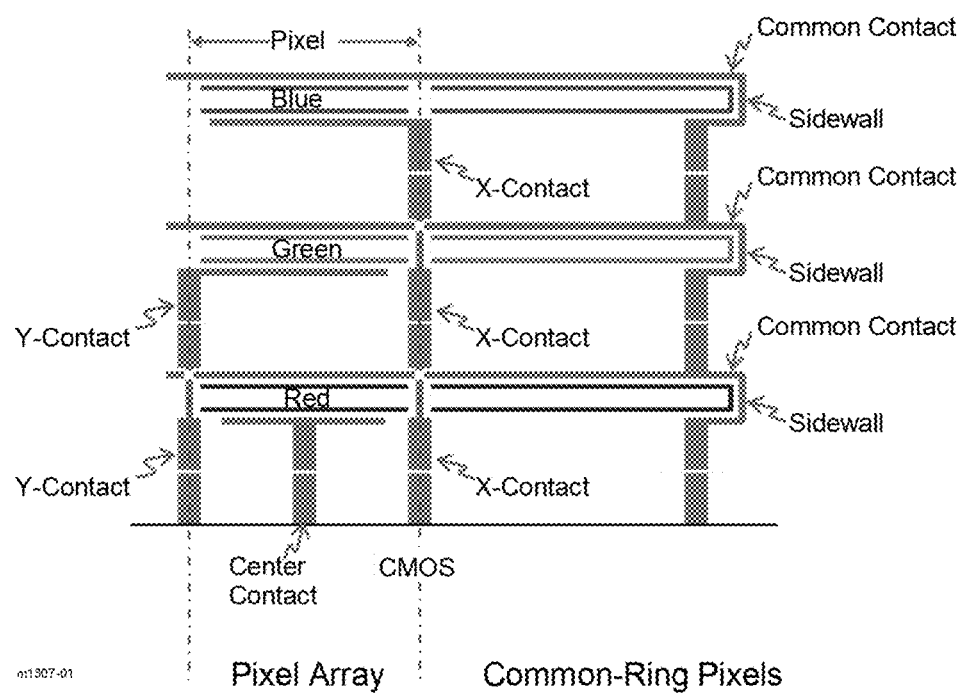
FIG. 8 illustrates a preferred embodiment of the micro-via contact array interface between the photonic layers and the silicon-based CMOS of the Nanophosphors-Converted Solid State Imager (NPC-SSI) of the invention.

The topside of each of the NPC-SSI dies comprise a Si-CMOS wafer including a micro-via array with a pattern matching the pattern of the micro-via array of the NPC-SSI in-process described in the previous paragraph. When the Si-CMOS wafer is aligned and bonded to the NPC-SSI in-process wafer using semiconductor bonding techniques such as fusion bonding, for example, the bonding interface micro-via array provides electrical contact between the unique contacts of the pixel arrays of the multiple photonic layers of the NPC-SSI as well as the common contact ring at the peripheral boundaries of each of the NPC-SSI dies comprising the NPC-SSI wafer as illustrated in FIG. 8. This FIG. 8 illustrates a part of the common contact vias forming a ring at the peripheral boundaries of the NPC-SSI die as well as the per pixel unique contacts, the X and Y contacts being 90 degrees from each other. The rest of FIG. 8 is highly schematic, the different layers being much more accurately illustrated in FIGS. 1(a) and 1(b). Of course after the final bonding step, whichever fabrication method is used, the wafer level end product is diced to provide the individual Nanophosphors-Converted Solid State Imagers (NPC-SSI) of the invention.

Figure 9:
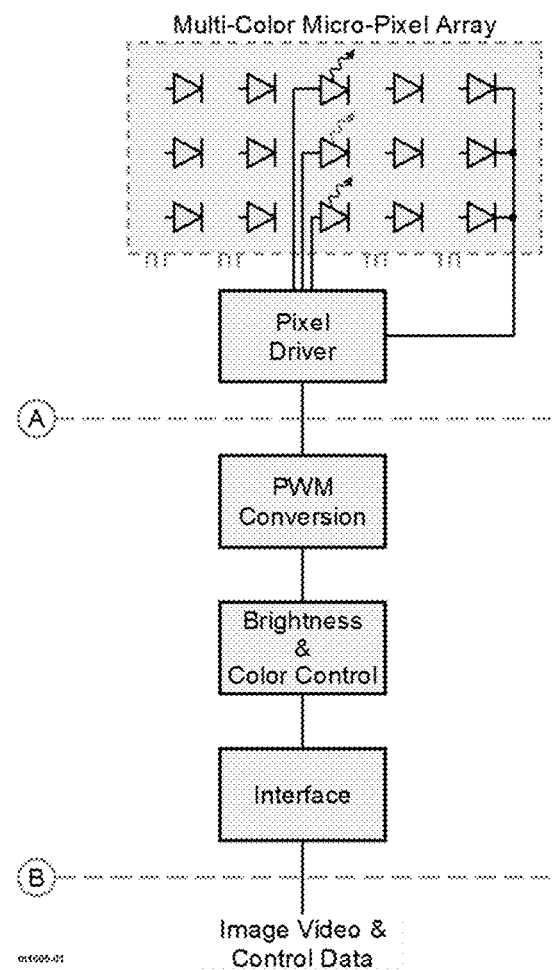
FIG. 9 illustrates a functional block diagram of the Nanophosphors-Converted Solid State Imager (NPC-SSI) of the invention.

FIG. 9 illustrates a functional block diagram of the NPC-SSI. FIG. 9 shows the multicolor micro-pixel array of the NPC-SSI being driven by the control logic of its Si-CMOS. FIG. 9 also shows two preferred configurations for the NPC-SSI Si-CMOS control logic with two related alternative interfaces. In a first preferred configuration, the function of the NPC-SSI Si-CMOS control logic includes only the multicolor micro-pixel array drivers and the NPC-SSI, which will receive pixel array bit-fields containing the pulse width modulation (PWM) bits for every color of each pixel from an external source.

In a second preferred configuration, the function of the NPC-SSI Si-CMOS control logic may include the logic functions required to generate PWM bit-fields for the multicolor micro-pixel array. In latter configuration, the NPC-SSI Si-CMOS control logic receives serial bit-streams containing the video and related control data through its interface block. In this configuration of the NPC-SSI Si-CMOS control logic, the received video bit-stream is processed by the color and brightness control block for de-gamma linearization, gamut transformation, white point adjustment and color and brightness uniformity correction across the micro-pixel array. The bit stream color and brightness control block are then converted to PWM bit-fields, then clocked into the pixel driver array. In effect in the latter configuration of the NPC-SSI Si-CMOS control logic, the NPC-SSI does not require external video stream processing support and operates with a standard high speed interface such as Low Voltage Differential Signaling (LVDS) interface. The latter configuration of the NPC-SSI Si-CMOS exhibits desirable lower power consumption and smaller volumetric aspects.

One of the primary advantages of the described NPC-SSI is its low power consumption which is achieved by multiple factors: (1) the high internal quantum efficiency (IQE) of its B emission and V-B excitation photonic layers; (2) the high quantum yield (QY) conversion efficiency of the nanophosphors layers associated with its G and R emission; (3) the increased conversion efficiency of its V-B excitation light by the light confinement actions of the NPC-SSI pixel optical confinement cavity; (4) the increased conversion efficiency of its V-B excitation light by the light confinement actions of the optical sub-cavities formed by the pixel's BPF layers and reflective sidewalls and contacts; and, (5) the spectral shaping actions of the pixel's BPF layers to match the HVS photopic response.

The low power consumption of the described NPC-SSI makes it very effective in display applications requiring small volumetric aspects and higher brightness at low power consumption such as near-eye displays for virtual and augmented reality (AR/VR) applications. For application in near-eye displays, the wavelengths selected are for example purposes and other selections of wavelengths following the same methods of this invention are possible and contemplated as falling within the scope of the invention. Also, the described emissive micro-scale pixels combined with the low power consumption of the described NPC-SSI make it very effective in light field display applications which typically require small volumetric aspects and higher brightness at low power consumption as well and desirably enables directionally-modulated micro-pixel emission. Of course the combination of these two display applications; namely, light field near-eye AR/VR display, stand to benefit substantially by the small volume, high brightness and low power consumption advantages of the NPC-SSI of this invention.

It should be mentioned that the emission and excitation wavelength values used in the preceding description of the NPC-SSI structure and method of fabricating this invention are exemplary illustrations of the methods of this invention. A person skilled in the art would know how to use the disclosed methods of this invention to create a nanophosphors-converted emissive micro-pixel spatial light modulator using a user-defined or different set of excitation light wavelengths to generate different sets of emission wavelengths. A person skilled in the art would know how use the disclosed methods of the NPC-SSI structure pixels optical confinement created by the pixels' reflective sidewalls, reflective contacts and bandpass filters (BPFs) with different design parameters to create high efficiency micro-pixel arrays.

Figure 10A:
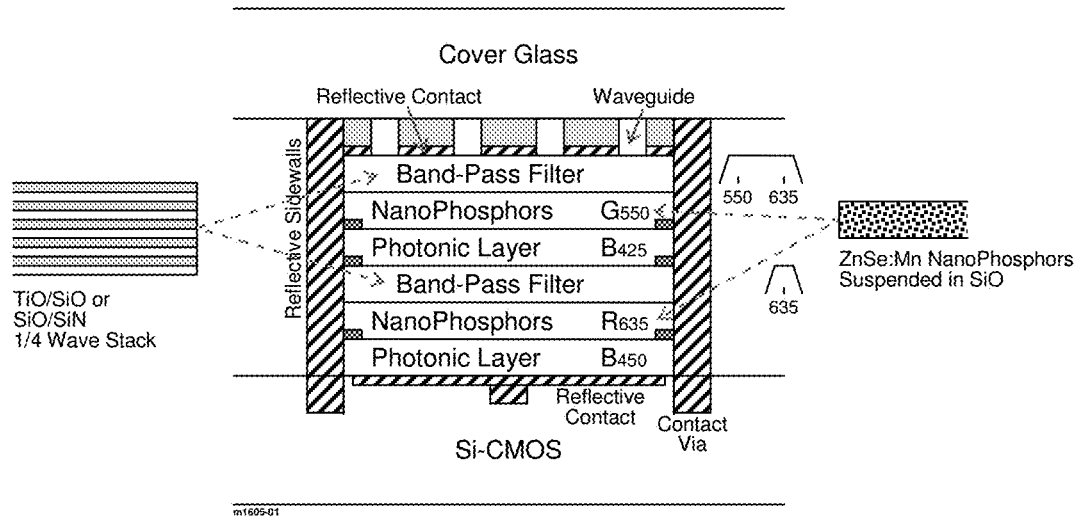
FIG. 10(a) illustrates a further alternate embodiment of the Nanophosphors-Converted Solid State Imager (NPC-SSI) of the invention.
Figure 10B:
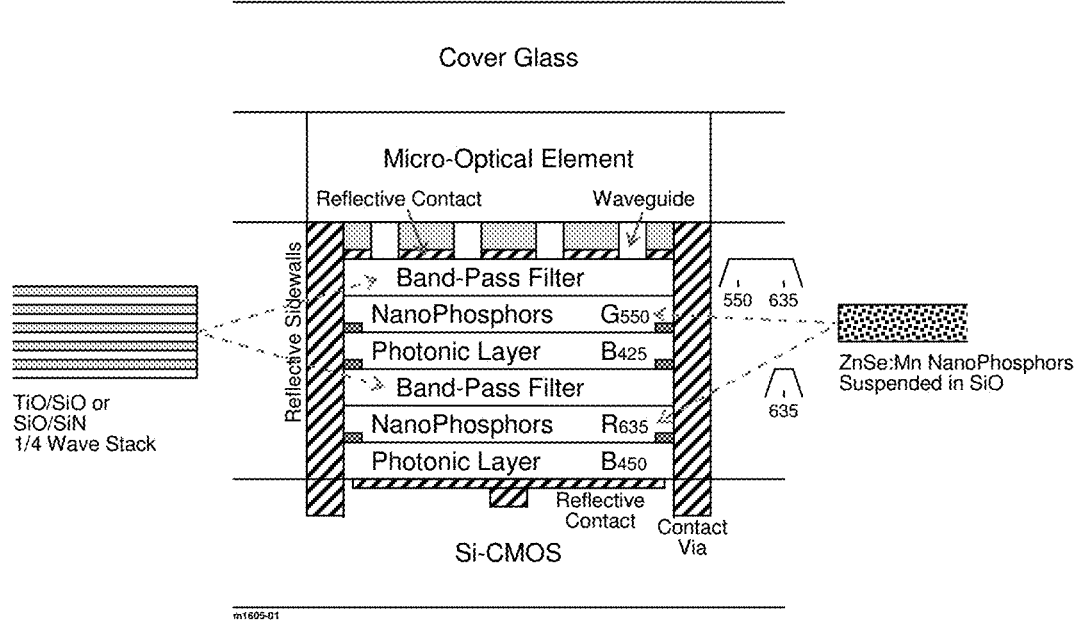
FIG. 10(b) illustrates a yet further alternative embodiment of the Nanophosphors-Converted Solid State Imager (NPC-SSI) of the invention.

FIG. 10(a) illustrates a further alternate embodiment of the Nanophosphors-Converted Solid State Imager (NPC-SSI) of the invention, and FIG. 10(b) illustrates a still further alternative embodiment of the Nanophosphors-Converted Solid State Imager (NPC-SSI) of the invention. In particular, FIG. 10(a) is similar to FIG. 1(a) and FIG. 10(b) is similar to FIG. 1(b), but without the third or blue or B465 photonic layer of FIGS. 1(a) and 1(b). Such a display would of course be limited to two colors, though within the limit, would still be controllable in chromaticity. Also while other colors could be used, red and green are very suitable exemplary colors as an example because those colors would be ideal for information/warning displays, as red conveys stop, beware or pay attention, while green conveys all is fine.

Figure 11A:
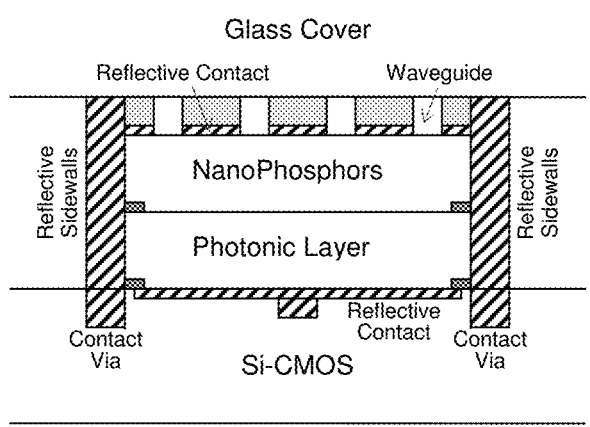
FIG. 11(a) illustrates a yet further alternative embodiment of the Nanophosphors-Converted Solid State Imager (NPC-SSI) of the invention for the efficient emission of white light.
Figure 11B:
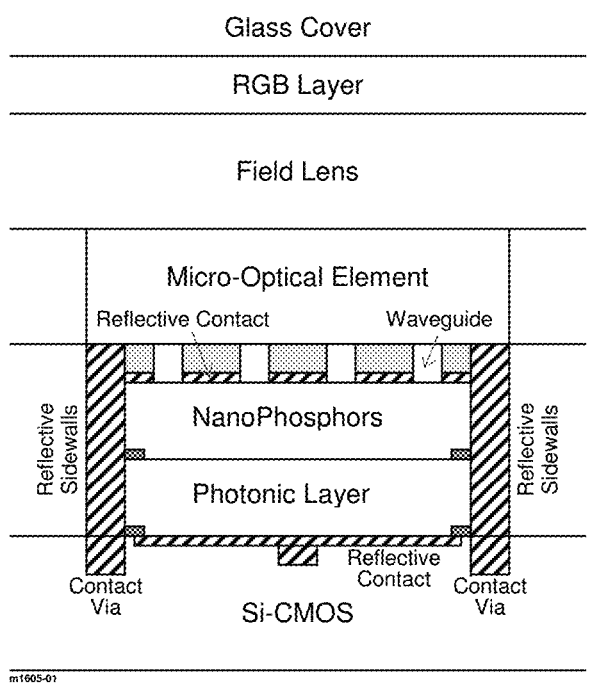
FIG. 11(b) illustrates a yet further alternative embodiment of the Nanophosphors-Converted Solid State Imager (NPC-SSI) of the invention for the efficient emission of white light comprising a micro optical element.

FIGS. 11(a) and 11(b) depict yet further embodiments of the Nanophosphors Converted Solid State Imager (NPC-SSI) of the invention as a solid state light emitting structure for the efficient emission of white light in a micro-pixel array.

Research and development work is ongoing in the field of general lighting using nanophosphors materials for white light in a general lighting LED, but such light emissions are neither pixelated nor produce collimated light as is enabled in the disclosed embodiment. Rather, most of the research and development in this lighting area relates to the use of bulk phosphors-converted LEDs with very large size pixels on the order of 100 microns or more.

Distinguishable from the use of bulk phosphors in the prior art, the disclosed embodiments of the invention of FIGS. 11(a) and 11(b) take advantage of pixel-level nanophosphors that is suspended or dispersed in an oxide material layer in a multilayer light emitting structure, enabling a very high conversion efficiency while preserving the pixelation effect. This in turn provides effective control of individual pixel brightness while minimizing or eliminating pixel cross-talk.

Undesirable pixel cross-talk is a prevalent condition when bulk phosphors is used in pixelated white light and such cross-talk has a tendency to degrade the effectiveness of pixel brightness control and thus limits many of its applications.

A second and unique aspect of the embodiments of FIGS. 11(a) and 11(b) is the incorporation of a pixel-level recycling optical confinement cavity and the micro optical elements of FIG. 11(b) which may be provided in the form of a micro-optical element or array of micro optical elements disposed over an array of such pixels.

The order of the layers for the optional micro-elements, field lens and RGB layer may be varied as desired, though it is preferred to position the array of micro-optical elements immediately over the reflective contact and waveguide layer.

In the embodiments of FIGS. 11(a) and 11(b), the photonic layer of the device may comprise solid state light emitting III-V semiconductor material, such as indium gallium nitride (InGaN) that can emit excitation light in the range from near ultraviolet (NUV) 405 nm wavelength to blue 460 nm wavelength.

The nanophosphors layer of the device may comprise II-VI semiconductor nanocrystalinephosphors nanoparticles formed, for example, using Manganese-doped Zinc Selenide (ZnSe:Mn). White light emission from the nanophosphors layer at a desired color rendering index (CRI) is achieved by controlling the Manganese (Mn) doping during the growth of the nanocrystalinephosphors nanoparticles such that some of the grown ZnSe:Mn nanocrystals exhibit multiple peak emissions in both the blue and yellow-orange segments of the visible light spectrum. When pumped by the light emitted from the photonic excitation layer of each micro-scale pixel, the ZnSe:Mn nanophosphors layer of the corresponding micro-scale pixels produces a broad spectrum white light emission having an intensity that is proportional with the intensity of the excitation light emitted by that pixel with the latter intensity being also proportional with the current level used to electrically pump the photonic layer of the corresponding micro-scale pixel.

Thus with the design of this embodiment, collimated white light can be selectively emitted from the individual micro-scale pixels comprising the array of micro-scale pixels of the photonic imager device with the intensity of the white light emitted from each individual micro-scale pixel also being selectively controlled by controlling the electrical current drive level of the photonic layer of each of the micro-scale pixels comprising the array of micro-scale pixels.

The photonic and nanophosphors layers in combination with the sub-optical confinement cavities and micro optical elements of FIG. 11(b) beneficially provide uniform white light collimation across the optical aperture of the device, increased conversion efficiency, and importantly, permit directional modulation that enables numerous applications including beam-steering white light emission as well as light field modulation when the disclosed pixelated white light modulator is used in conjunction with red, blue and green (RGB) filters as a display device, as shown in FIG. 11(b).

A further advantage of this embodiment is that a very small pixel pitch is achievable that enables ultra-high resolution, approaching a micron. Such an ultra-high resolution is achievable because only a single unique contact per pixel is needed to enable pixel modulation directly or by means of active matrix drive circuitry. This in turn permits the creation of a very powerful light field display that achieves perceived resolution comparable to today's 2D displays but in 3D digital holography.

For the efficient pixelated white light micro-scale pixel array device of the above alternate embodiment, the nanophosphors composition and doping are selected to have a predetermined set of intermediate band gaps that are configured to cause the nanophosphors to directly emit white light when excited by near-UV (NUV) to blue light in the range from 405 nm to 460 nm. In this embodiment, only one nanophosphors excitation layer is required and the bandpass (BPF) layers of the earlier described multicolor embodiments are not required at all, making the structure both simple, robust and inexpensive to manufacture.

The micro optics layer of the pixels in the embodiment illustrated in FIG. 11(b) is designed to collimate the emitted white light. The associated optical confinement cavity is designed to recycle the white light that is emitted by the pixels' layers that is outside the target collimation range (etendue), thus making the described embodiment of a pixelated white light modulator highly efficient. This is so in that the structure directly emits collimated white light uniformly across its entire optical aperture, a function that up until now has been performed using a set of complex optics that are very bulky and cause loss of a significant portion of the generated, inherently Lambertian light.

Because the emitted collimated white light of this embodiment is pixelated and can be provided in a display imager (light modulator) structure having addressable and adjustable pixel light emission intensity with the ability to directionally modulate the pixels' collimated light across a wide FOV, the device enables a steerable collimated white light display having no mechanical parts or focusable optics.

Such a white light emitting structure can also be used in conjunction with RGB filters, similar to those used in LCD and OLED, to create a multicolor display that is very bright and very power efficient and can be used in digital holography light field modulation applications.

Additionally, the above pixelated white light emitting structure can be used in conjunction with either a single field lens or with a micro lens structure in front of it as shown in FIG. 11(b) to realize an electronically steerable automobile headlight that is reliable and less bulky than those currently available. Such a field lens or micro lens structure may be configured to direct the output of a pixel or predetermined set of pixels in a predetermined direction. Such a steerable white light emitting structure can modulate the light intensity pixel-by-pixel to minimize or eliminate the glare effects of rain, fog, snow or the headlight glare to other cars.

In an embodiment where the pixelated white light emitting structure is used to realize an electronically steerable automobile headlight, the pixel array of the structure may be partitioned into groups, herein referred to as directional modulation pixel groups, and with each such group, the pixel-level micro lens elements of each of the pixels comprising the directional modulation group are configured to direct the output of a pixel or predetermined set of pixels in a predetermined direction. Thus the white light emitting pixels with their corresponding pixel-level micro lens comprising the directional modulation group can emit light in any given direction by turning on the specific pixel within the directional modulation group that emits light in the selected direction.

In order to further collimate the light emitted from each directional modulation group, each directional modulation group may also be associated with a field (e.g., Fresnel) micro lens element configured to direct the output of a pixel or predetermined set of pixels in a predetermined direction. The field lens is preferably disposed between the micro lens elements and the cover glass. Such a Fresnel structure is designed to make the pixelated white light micro-pixel array of this embodiment capable of emitting collimated white light in any specific direction by turning on the pixels that emit light in the selected direction in all or some of the directional modulation groups comprising the micro-pixel array of the pixelated white light emitting structure.

It should be noted that not only can the white light emitted from the pixelated white light emitting structure of this embodiment be electronically pointed (or steered) in any one of multiple directions, but also the intensity of the emitted light in the selected direction can be controlled by controlling the intensity of the light emitted by the contributing pixels within each of the directional modulation groups. Furthermore, the optical aperture size (or beam width) of the emitted white light can be controlled by controlling the number of directional modulation groups used to generate the directional light beam from the pixelated white light emitting structure of this embodiment.

In the embodiment where the pixelated white light emitting structure is used to realize a light field display, the pixel array of the structure would also be partitioned into directional modulation groups. With each such group, the pixel-level micro lens elements of each of the pixels comprises the directional modulation group and is designed to direct the light emitted from its corresponding pixel in a unique direction.

Each of the directional modulation groups in this case may include pixels having red (R), green (G) and blue (B) filters preferably disposed between the micro optical elements and the cover glass such that each of the directional modulation groups can be controlled to emit color and intensity-modulated light in any given direction. Also in order to further collimate the color and intensity-modulated light emitted from each directional modulation group, each directional modulation group could also be associated with a field (Fresnel) micro lens element that is designed to make the RGB light emitting micro-pixel array of this embodiment capable of emitting collimated RGB light in any specific direction by turning on the pixels that emit the RGB light in the selected direction in all or some of the directional modulation groups comprising the micro-pixel array of the RGB light emitting structure.

With the described capability of the directionally modulated RGB light of this embodiment, it is possible to use the described RGB emitting micro-pixel array to modulate the color and intensity associated with a multiplicity of views within the light field in the direction associated with each such view in order to enable depth perception by a viewer.

The solid state imagers of the present invention may be fabricated, for example, by forming a semiconductor light emitting photonic wafer of a photonic layer on an epitaxial growth buffer layer on a first substrate, pixelating the semiconductor light emitting photonic wafer by etching pixel sidewalls and contact openings, passivating the pixel sidewalls and contact openings, then coating the pixel sidewalls and contact openings with reflective metal and filling the pixel sidewalls and contact openings with metal, then depositing contact patterns and a waveguide layer on the pixelated semiconductor light emitting photonic wafer, the contact pattern for the photonic layer contacting the metal in the contact openings and forming upper contacts of the pixelated semiconductor light emitting photonic wafer. The method further comprises depositing a nanophosphors nanoparticle structure for emitting white light when excited by an emission of the photonic layer, etching pixel sidewalls, passivating the pixel sidewalls, then coating the pixel sidewalls with reflective metal and filling the pixel sidewalls with metal to extend the pixel sidewalls through the nanophosphors nanoparticle structure. Then a reflective waveguide layer is deposited over the nanophosphors nanoparticle structure, then bonding the reflective waveguide layer to a glass cover wafer, lifting off the first substrate and removing the epitaxial growth buffer layer, bonding the result to a drive circuitry wafer, and dicing the result to provide the solid state imagers, each solid state imager having a drive circuitry chip, a photonic layer over the drive circuitry chip, a nanophosphors nanoparticle structure over the photonic layer for emitting white light when excited by the emission of the photonic layer, a reflective waveguide layer over the nanophosphors nanoparticle structure and a glass cover.

Optionally, an array of micro-optical elements may be formed on the glass cover wafer so that the array of micro-optical elements is disposed between the glass cover wafer and the nanophosphors nanoparticle structure for modulating the direction of each pixel's light emission. The micro-optical elements may be sized and the following pixels aligned with the array of micro-optical elements to provide a single micro-optical element for each pixel.

The nanophosphors nanoparticle structure may be nanophosphors particles suspended in a silicon oxide layer formed by mixing the nanophosphors particles into liquid-form Spin-on-Glass at a user-defined ratio to achieve a desired level of excitation light absorption, then the liquid mixture is coated as a thin layer and cured by annealing it into the silicon oxide layer, resulting in the nanophosphors particles being suspended in the nanophosphors nanoparticle structure.

The method may further consist of forming an RGB filter layer below the glass cover wafer, and may further include forming a field lens layer below the glass cover wafer, which may be a Fresnel lens. Normally the RGB filter layer below the glass cover would be formed on the glass cover wafer, the field lens layer formed on the RGB filter layer and the array of micro-optical elements formed on the field lens layer. Optionally, the order of the layers may be changed and/or some or all of the layers may be fabricated in a desired order on the nanophosphors nanoparticle structure, though preferably the array of micro-optical elements is in the first layer above the nanophosphors nanoparticle structure. The nanophosphors nanoparticle structure may be comprised of II-VI semiconductor nanocrystalinephosphors nanoparticles configured to have multiple peak emissions in both a blue and yellow-orange segment of a visible light spectrum for emitting white light having a predetermined color rendering index (CRI) when excited by the emission of the photonic layer.

Thus, the present invention has a number of aspects, which aspects may be practiced alone or in various combinations or sub-combinations, as desired. Also while certain preferred embodiments of the present invention have been disclosed and described herein for purposes of exemplary illustration and not for purposes of limitation, it will be understood by those skilled in the art that various changes in form and detail may be made therein without departing from the spirit and scope of the invention.

What is claimed is:

1. A solid state white light imager comprising:
   a drive circuitry chip;
   a photonic layer over the drive circuitry chip for emitting light of a wavelength in a range from near ultraviolet to blue light;
   a nanophosphors nanoparticle structure over the photonic layer for emitting white light when excited by the emission of the photonic layer;
   a contact and waveguide layer over the nanophosphors nanoparticle structure;
   the photonic layer and nanophosphors nanoparticle structure defining an LED or laser diode and together collectively defining a micro-scale pixel array;
   wherein each pixel in the micro-scale pixel array is individually addressable spatially and temporally.

2. The solid state white light imager of claim 1 wherein nanoparticles in the nanophosphors nanoparticle structure are II-VI semiconductor nanocrystalinephosphors nanoparticles having doping selected to have multiple peak emissions in both a blue and yellow-orange segment of a visible light spectrum for emitting white light having a predetermined color rendering index (CRI) when excited by the emission of the photonic layer.

3. The solid state white light imager of claim 1 wherein the contact and waveguide layer defines waveguides through which the white light passes and a cover glass over the contact and waveguide layer.

4. The solid state white light imager of claim 3 wherein a micro-optical element is disposed between the contact and waveguide layer and the cover glass for modulating the direction of each pixel's light emission.

5. The solid state white light imager of claim 4 wherein there is a single micro-optical element for each pixel of the micro-scale pixel array.

6. The solid state white light imager of claim 4 further comprising a field lens configured to direct a pixel light output in a predetermined direction.

7. The solid state white light imager of claim 6 wherein the field lens is a Fresnel lens.

8. The solid state white light imager of claim 1 further comprising an RGB filter.

9. The solid state white light imager of claim 1 wherein openings in the contact and waveguide layer define waveguides having a diameter, height and spacing selected to obtain a degree of collimation.

10. The solid state white light imager of claim 1 wherein the nanophosphors nanoparticle structure comprises Manganese-doped Zinc Selenide nanoparticles having an outer shell of Zinc Selenide (ZnSe).

11. The solid state white light imager of claim 1 wherein the nanophosphors nanoparticle structure comprises Europium ($Eu^{3+}$)-doped Yttrium Oxide ($Y_2O_3$) nanoparticles.

12. The solid state white light imager of claim 1 wherein the nanophosphors nanoparticle structure comprises Eu-doped Strontium Silicate (($Sr,Ba,Ca)_3SiO_5$:Eu) nanoparticles.

13. The solid state white light imager of claim 1 wherein the nanophosphors nanoparticle structure comprises first and second nanophosphors nanoparticles suspended in the nanophosphors nanoparticle structure.

14. The solid state white light imager of claim 1 further comprising a reflective contact and waveguide layer between the drive circuitry chip and the photonic layer, wherein sidewalls between pixels are reflective, wherein the contact and waveguide layer is reflective, wherein the LED or laser diode is included in a stack of LEDs or laser diodes and has an optical confinement cavity, and wherein a reflected light is recycled in the optical confinement cavity resulting in an increased nanophosphors conversion efficiency for the nanophosphors nanoparticle structure.

15. The solid state white light imager of claim 1 wherein the nanophosphors nanoparticle structure comprises nanophosphors particles suspended in a silicon oxide layer deposited on a topside of the photonic layer by mixing the nanophosphors particles into liquid-form Spin-on-Glass at a user-defined ratio to achieve a desired level of excitation light absorption, then the liquid mixture is coated as a thin layer on top of the photonic layer and cured by annealing into the silicon oxide layer resulting in the nanophosphors particles being suspended in the nanophosphors nanoparticle structure.

* * * * *